(12) United States Patent
Ishida

(10) Patent No.: US 6,831,823 B2
(45) Date of Patent: Dec. 14, 2004

(54) METHOD AND APPARATUS FOR CHUCKING A SUBSTRATE

(75) Inventor: Shuya Ishida, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

(21) Appl. No.: 10/212,870

(22) Filed: Aug. 7, 2002

(65) Prior Publication Data

US 2003/0030961 A1 Feb. 13, 2003

(30) Foreign Application Priority Data

Aug. 13, 2001 (JP) ..................... P. 2001-245227

(51) Int. Cl.$^7$ .............................................. H02N 13/00
(52) U.S. Cl. ..................................... 361/234; 361/233
(58) Field of Search ................................ 361/234, 233, 361/235; 279/128

(56) References Cited

U.S. PATENT DOCUMENTS 6,125,025 A   9/2000   Howald et al.
6,187,149 B1 * 2/2001 Sun et al. ................... 204/164
6,236,555 B1 * 5/2001 Leeser ......................... 361/234

FOREIGN PATENT DOCUMENTS

| EP | 0 822 590 A2 | 2/1998 |
| EP | 1 096 561 A2 | 4/2001 |
| JP | 04-247639 | 3/1992 |
| JP | 04-213854 | 4/1992 |
| JP | 4-213854 | 8/1992 |
| JP | 06-204117 | 7/1994 |

* cited by examiner

Primary Examiner—Brian Sircus
Assistant Examiner—Zeev Kitov
(74) Attorney, Agent, or Firm—Finnegan, Henderson, Farabow, Garrett & Dunner, L.L.P.

(57) ABSTRACT

A substrate chucking apparatus includes an electrostatic chuck for electrostatically chucking a substrate, and a DC power supply for applying a DC chucking voltage to the electrostatic chuck. An amplitude of the chucking voltage Vc is exponentially decreased with respect to a chucking time after an operation of chucking the substrate starts. Such a control of the chucking voltage variation is executed by a control device.

3 Claims, 5 Drawing Sheets

METHOD AND APPARATUS FOR CHUCKING A SUBSTRATE

BACKGROUND OF THE INVENTION

1. Field of the Invention

The present invention relates to a method and apparatus for chucking a substrate, the apparatus comprising an electrostatic chuck for electrostatically chucking and holding a substrate to be processed. More particularly, the present invention relates to a method and apparatus for chucking a substrate which are capable of producing a sufficiently high chucking force during the substrate chucking operation, and making it easy to separate the substrate after the chucking operation ends. For example, the substrate chucking apparatus is used for an ion implanter, ion doping apparatus, ion beam etching apparatus, plasma CVD apparatus, thin film forming apparatus and the like.

2. Description of the Related Art

A related-art substrate chucking apparatus of this type is shown in FIG. 4. The substrate chucking apparatus includes an electrostatic chuck 6 of the bipolar type, and a DC power supply 14 of the bipolar output type. The electrostatic chuck 6 electrostatically chucks a substrate 4 (e.g., a semiconductor wafer). The DC power supply 14 applies DC chucking voltages Vc whose polarities are opposite to each other and values are equal to two electrodes 10 and 12 of the electrostatic chuck 6.

In this example, the electrostatic chuck 6 is constructed such that, for example, two semicircular electrodes 10 and 12 are buried in a surface region of an insulating member 8 made of ceramics, e.g., alumina, while being oppositely arrayed so as to form a circle.

In this example, the DC power supply 14 includes a positive power supply 16 of the output voltage variable type and a negative power supply 18 of the output voltage variable type. The positive power supply 16 outputs a positive chucking voltage Vc (+Vc). The negative power supply 18 outputs a negative chucking voltage Vc (−Vc). In the specification, the positive or negative chucking voltage will be referred simply to as a chucking voltage Vc where there is no need of taking the polarity into consideration. The same thing is correspondingly applied to the drawings.

When the chucking voltage Vc is applied from the DC power supply 14 to the electrostatic chuck 6, positive and negative electric charges are accumulated between the substrate 4 and the electrodes 10 and 12. The substrate 4 is chucked to and held with the electrostatic chuck 6 by an electrostatic force acting between the substrate 4 and the electrodes 10 and 12. In this state, ion beams 2, for example, are irradiated onto the substrate 4, whereby a desired process, e.g., ion injection, may be carried out.

FIG. 5 is a graph showing various characteristics of the electrostatic chuck of each of FIGS. 1 and 4 when the substrate 4 is chucked to the electrostatic chuck 6 while the chucking voltage is fixed. Curve A shows time-dependency of the chucking force, which ranges from the start of chucking operation, when the chucking voltage is fixed. Curve B shows elapsing time dependency (curve B) of residual chucking force, which ranges from turning off of the chucking voltage after applying the chucking voltage for 1800 seconds (chucking time=1800 seconds). Curve C shows chucking-time dependency of the residual chucking force when five seconds has elapsed after the chucking voltage is turned off.

The curve A shows that the chucking force rapidly increases immediately after the chucking operation starts, and is gradually saturated with time. The curve B shows that the residual chucking force is present after the chucking is turned off (viz., the chucking voltage Vc is turned off), and it exponentially decreases. The curve C shows that the residual chucking force becomes larger as the chucking time is longer (or substantially proportional to the chucking time) when observed at a fixed time (e.g., 5 seconds) after the chucking is turned off.

When the amplitude of the chucking voltage Vc is varied, simply the chucking voltage Vc is more increased, the chucking force and the residual chucking force are more increased. When the chucking voltage Vc is more decreased, the chucking force and the residual chucking force are more decreased. Usually, the electrostatic chuck 6 other than those shown in FIGS. 1 and 4 has also characteristics similar to that of FIG. 5.

In the electrostatic chuck 6, the residual chucking force is present after the chucking voltage Vc is turned off. Accordingly, it is difficult to separate the substrate 4 from the electrostatic chuck 6.

To cope with this, there is proposed a technique as disclosed in Japanese Patent Unexamined Publication No. Hei. 4-213854. In the technique, as shown in FIG. 6, the chucking voltage Vc to be applied is changed in two steps at predetermined timings.

More specifically, the chucking voltage Vc of a large value ($V_1$) is applied to the electrostatic chuck when chucking of the substrate 4 to the electrostatic chuck 6 starts (time 0 to t1). Thereafter, when the substrate 4 is processed, the chucking voltage Vc is changed to the chucking voltage Vc of a small value ($V_2$) (after time t2), and then the voltage of the small value V2 is maintained till the process ends (t3). The amplitude of the chucking voltage Vc may be gradually decreased between t1 (e.g., 10 seconds) and t2 (e.g., 15 seconds) or may be suddenly decreased at t2 as indicated by two-dot chain line D.

The technique of the publication describes that by, preventing an excessive chucking force at the time of processing the substrate 4, generation of residual charge is prevented to thereby to making it easy to separate the substrate 4 after the substrate processing.

With diversification of the substrate processing, the chucking time of the substrate 4 by the electrostatic chuck 6 sometimes is longer, and the timing of starting the substrate 4 processing sometimes is shifted. Where a measure in which the chucking voltage Vc is changed in two steps at predetermined timings, as in the publication mentioned above, is used, it is difficult to flexibly cope with the circumstance changes.

The reason for this is that in some circumstances, the time that the substrate 4 is chucked to the electrostatic chuck 6 sometimes becomes long or short before the substrate processing starts. Accordingly, it is difficult to determine the voltage change time t2. The same difficulty also occurs in the control of changing that timing.

Further, when the time t2 is long (large), the chucking time is long. In addition, the chucking time by the chucking voltage Vc, which is a higher voltage (V1), is long, and the residual chucking force is also large as described in connection with the curve C in FIG. 5. Accordingly, the separation of the substrate 4 after the chucking is turned off is difficult.

In some circumstances, the substrate processing time sometimes is long (viz., the time t3 is long). Also in this case, the chucking voltage is a lower voltage V2, but the chucking time under a fixed chucking voltage Vc (voltage V2) is long. Accordingly, as described in connection with the curve C in FIG. 5, the residual chucking force is large, and the separation of the substrate 4 after the chucking is turned off is difficult.

SUMMARY OF THE INVENTION

Accordingly, an object of the present invention is to provide a method and apparatus which are capable of producing a sufficiently high chucking force during the substrate chucking operation irrespective of the chucking time length and the substrate processing timings, and making it easy to separate the substrate after the chucking operation ends.

In order to accomplish the object above, the following means are adopted. According to the present invention, there is provided a method for chucking a substrate used for an substrate chucking apparatus having an electrostatic chuck for electrostatically chucking the substrate and a power supply for applying a chucking voltage to the electrostatic chuck, the method comprising: controlling an amplitude of the chucking voltage so that the amplitude of the chucking voltage is exponentially decreased with respect to a chucking time after an operation of chucking the substrate starts (in other words, its decreasing profile is defined by an exponential function)

In order to accomplish the object above, the following means are adopted. According to the present invention, there is provided an apparatus for chucking a substrate comprising: an electrostatic chuck for electrostatically chucking the substrate; a power source for applying a chucking voltage to the electrostatic chuck; and a control device for controlling an amplitude of the chucking voltage so that the amplitude of the chucking voltage is exponentially decreased with respect to a chucking time after an operation of chucking the substrate starts. The electrostatic chuck may have an insulating member and an electrode contained in the insulating member and wherein the chucking voltage is applied to the electrode of the electrostatic chuck.

The chucking force of the electrostatic chuck acting on the substrate rapidly increases immediately after the chucking operation starts, and is gradually saturated with time, as indicated by the curve A in FIG. 5. Accordingly, on the contrary, when the amplitude of the chucking voltage is exponentially decreased with respect to the chucking time, the chucking force high enough to hold the substrate may be produced.

In addition, by exponentially decreasing the amplitude of the chucking voltage, even if the chucking time of the substrate is long, it is possible to prevent an increase of the a residual chucking force represented by the curve C in FIG. 5, which is present after the chucking voltage is turned off. Accordingly, it is easy to separate the substrate after the chucking operation ends.

In the related-art technique, the amplitude of the chucking voltage is varied in two steps at predetermined timings. On the contrary, in the present invention, the amplitude of the chucking voltage is exponentially decreased with respect to the chucking time, viz., the amplitude of the chucking voltage is continuously and exponentially decreased with the elapse of the chucking time. Therefore, there is no need of taking the chucking voltage changing timings into consideration. In other words, there is no need of taking the chucking time before the substrate processing and the timings at which the substrate processing starts into consideration. The necessity is only that the amplitude of the chucking voltage Vc is exponentially decreased with respect to the chucking time Tc. Accordingly, the chucking voltage control is also easy.

As a result, a sufficiently high chucking force is produced during the substrate chucking operation irrespective of the chucking time length and the substrate processing timings. Further, it is easy to separate the substrate after the chucking operation ends.

DETAILED DESCRIPTION OF THE INVENTION

Figure 1:
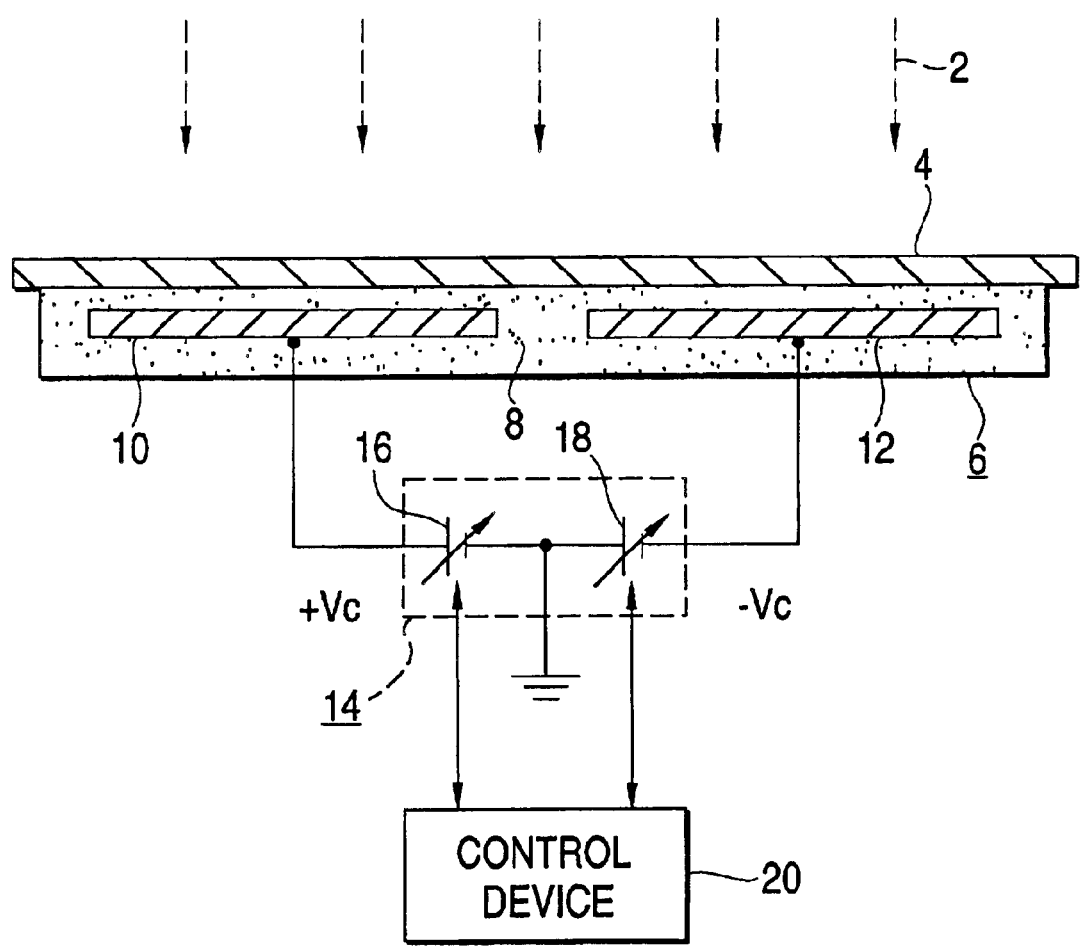
FIG. 1 is a diagram showing a substrate chucking apparatus for executing a substrate chucking method of the present invention.
Figure 4:
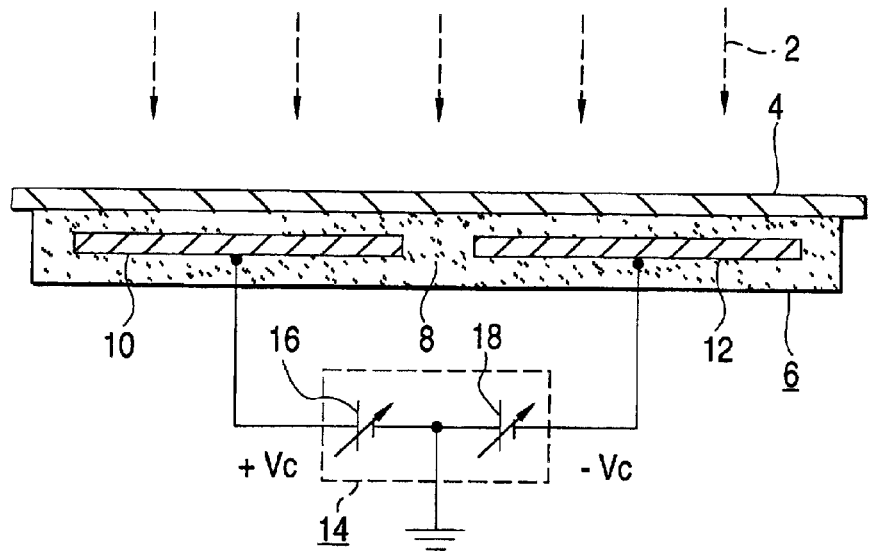
FIG. 4 is a diagram showing a related-art substrate chucking apparatus.

FIG. 1 is a diagram showing a substrate chucking apparatus for executing a substrate chucking method of the present invention. In the figure, the like or equivalent portions in the related art description, which was made in FIG. 4, are designated by like reference numerals. Description will be given placing emphasis on the difference of the embodiment from the related-art apparatus.

Figure 2:
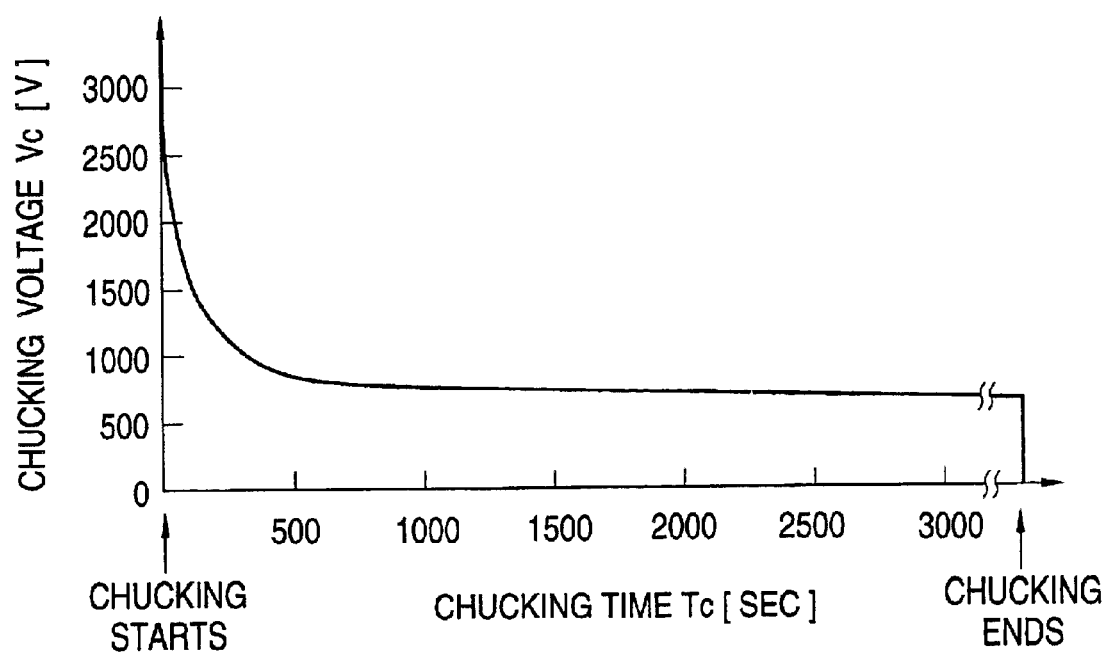
FIG. 2 is a graph showing a profile of a chucking voltage variation, which is essential to the present invention.

In the substrate chucking apparatus, after the electrostatic chuck 6 starts to chuck a substrate 4, an amplitude of a chucking voltage Vc is exponentially and smoothly decreased with respect to a chucking time Tc, (viz., as a chucking time Tc elapses), as in a case shown in FIG. 2. In the specification, the term "start of chucking the substrate 4" involves a time point where the substrate is put on the electrostatic chuck 6, and the application of the chucking voltage Vc to the electrostatic chuck starts. From this point of time, the chucking voltage Vc is exponentially and smoothly decreased. The term "chucking time Tc" means a time that the electrostatic chuck 6 chucks and holds the substrate 4. When the chucking operation ends, viz., when the substrate 4 is removed, the chucking voltage Vc is turned off (set at the 0V).

For example, when a plurality of substrates 4 are attached to and detached one by one from the electrostatic chuck 6 as in a sheet-by-sheet process, what one has to do is to repeat the application of the chucking voltage Vc as profiled in FIG. 2, by a necessary number of times.

In the instance embodiment, a control for exponentially decreasing the chucking voltage Vc as mentioned above is executed by a control device 20. Specifically, the control device 20 receives a signal indicating that the chucking voltage Vc is turned on from a DC power supply 14 (more exactly, a positive power supply 16 and a negative power supply 18. The same shall apply hereinafter.), and counts the chucking time Tc. Further, the control device 20 also applies to the DC power supply 14 a signal for controlling an amplitude of the chucking voltage Vc so that it exponentially decrease with the elapse of the chucking time Tc.

Figure 5:
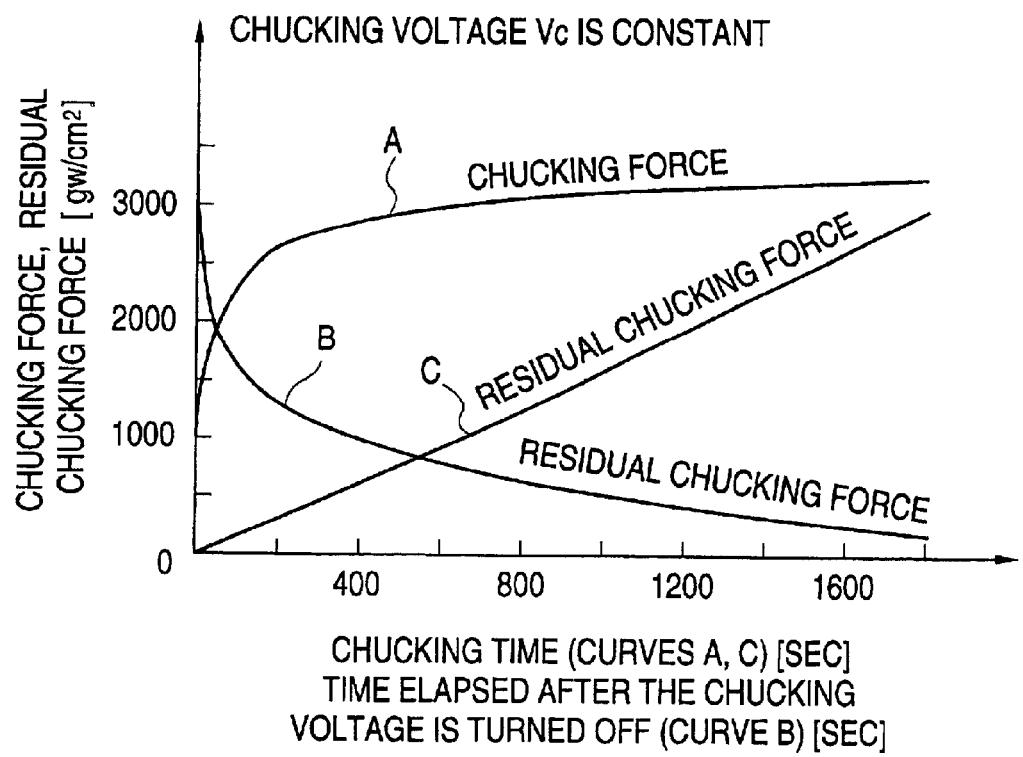
FIG. 5 is a graph showing various characteristics of the electrostatic chuck of each of FIGS. 1 and 4 when the substrate is chucked to the electrostatic chuck while the chucking voltage is fixed.
Figure 6:
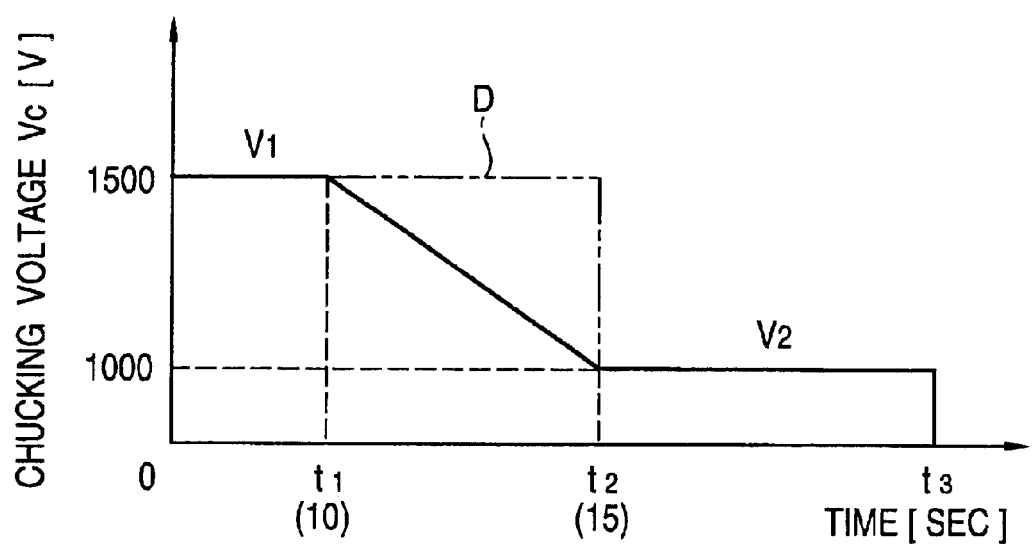
FIG. 6 is a diagram showing a related-art chucking voltage profile.

As indicated by the curve A in FIG. 5, a chucking force of the electrostatic chuck 6 to the substrate 4 rapidly increases immediately after the chucking operation starts (i.e., at the area where chucking time is short), and thereafter is gradually saturated with time. Accordingly, on the contrary, even if the amplitude of the chucking voltage Vc is exponentially decreased with respect to the chucking time Tc after the chucking operation starts, an chucking force high enough to hold the substrate 4 may be produced.

Additionally, by exponentially decreasing the amplitude of the chucking voltage Vc, even if the chucking time of the substrate 4 is long, it is possible to prevent an increase of the a residual chucking force, indicated by the curve C in FIG. 5, which is present after the chucking voltage is turned off. Accordingly, it is easy to separate the substrate 4 after the chucking operation ends.

In the invention, the amplitude of the chucking voltage Vc is continuously, smoothly, and exponentially decreased with the elapse of the chucking time Tc, while in the related-art technique, the amplitude of the chucking voltage Vc is varied in two steps at predetermined timings. Therefore, there is no need of taking the chucking voltage changing timings into consideration. A substrate processing may be started at any time point on a curve of FIG. 2 after the chucking operation starts. A chucking time Tc may be longer or shorter a predetermined one. In other words, there is no need of taking the chucking time before the substrate processing and the timings at which the substrate processing starts into consideration. The necessity is only that the amplitude of the chucking voltage Vc is exponentially decreased with respect to the chucking time Tc. Accordingly, the chucking voltage control is also easy.

As a result, a sufficiently high chucking force is produced during the substrate chucking operation irrespective of the chucking time Tc length of the substrate 4 and the substrate processing timings. Further, it is easy to separate the substrate 4 after the chucking operation ends.

A method for setting up a chucking voltage Vc profiled as shown in FIG. 2 will be described with reference to FIG. 3.

A substrate chucking apparatus shown in FIG. 1, which is used for an actual ion injector, was used. By using the apparatus, the following values of the chucking voltage Vc every chucking time Tc (viz., the chucking time Tc was used as a parameter) were measured: values of the chucking voltages Vc which are insufficient for chucking the substrate 4 (denoted as X in the figure); values of the chucking voltages Vc which are sufficiently high for chucking the substrate 4 (denoted as ●); values of the chucking voltages Vc which are sufficiently high for chucking the substrate 4 and make it easy to separate the substrate 4 (denoted as ○); values of the chucking voltages Vc which are sufficiently high for chucking the substrate 4, but it is difficult to separate the substrate 4 under those voltages (denoted as △); and values of the chucking voltages Vc which are sufficient for chucking the substrate 4, but it is impossible to separate the substrate 4 under those voltages (denoted as □). Such a measurement was conducted plural times by changing the chucking time Tc, and a curve E connecting points ● and a curve F connecting points ○ were obtained.

The chucking voltage Vc is set within an area between the curves E and F. A curve G in FIG. 3 is an example of such. In this way, the chucking voltage Vc may be obtained which provides a sufficient chucking of the substrate 4 and an easy separation of the substrate for a desired chucking time Tc.

Accordingly, what a designer has to do is to set (store) such a characteristic in the control device 20 and to cause it to control the chucking voltage Vc.

Figure 3:
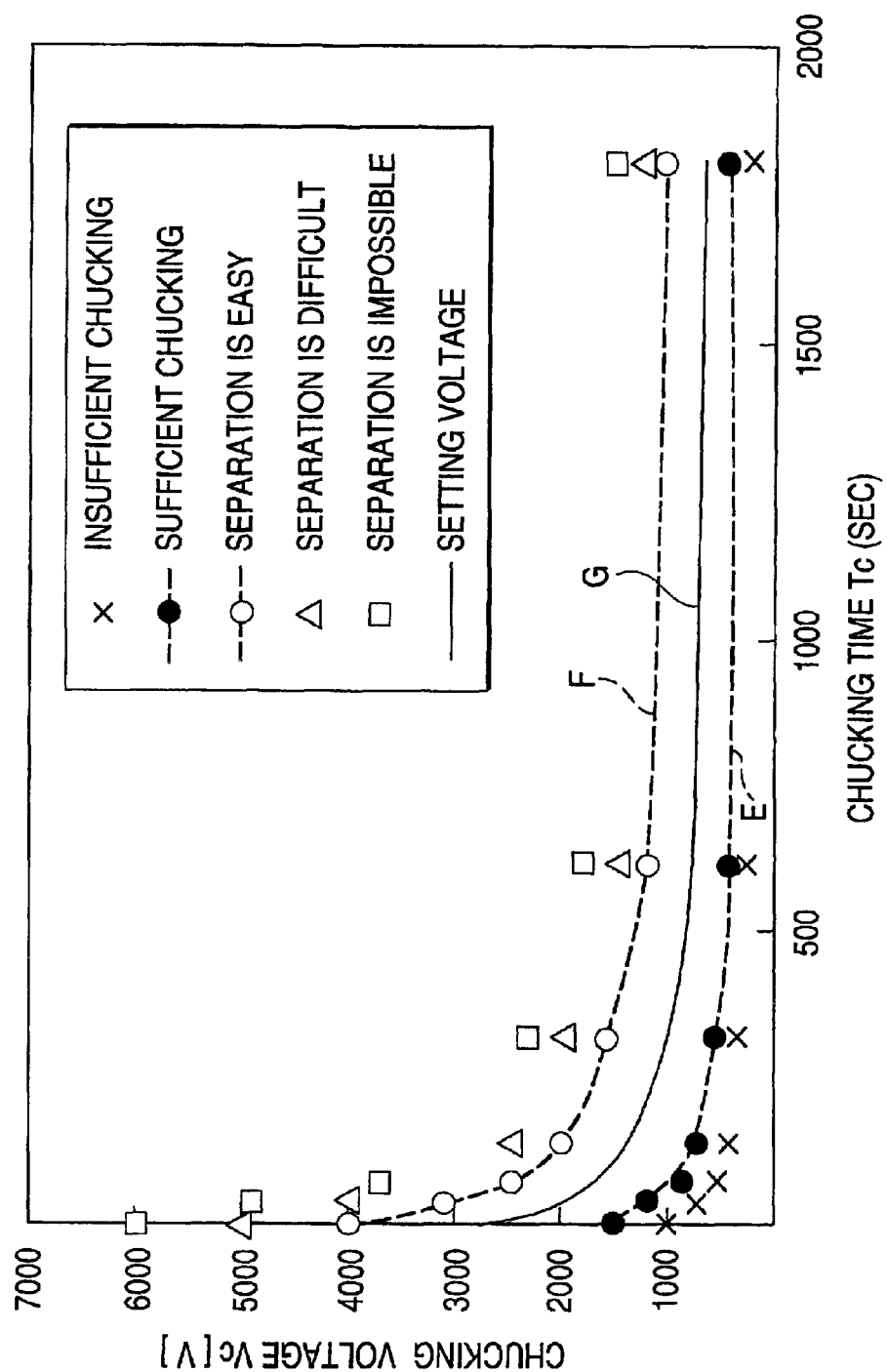
FIG. 3 is a graph showing a method for setting up a chucking voltage profiled as shown in FIG. 2.

The character like that of FIG. 3 may be obtained in a manner that the chucking voltage Vc is used as a parameter, and the chucking times Tc for the insufficient chucking, sufficient chucking, easy separation, difficult separation, and separation being impossible are obtained.

It should be understood that the invention is not limited to the electrostatic chuck 6 of the bipolar type as mentioned above, but may be applied to an electrostatic chuck of the unipolar type, which has a single electrode. In the case, the DC power supply 14 may be of the unipolar type which outputs positive or negative chucking voltage Vc.

As seen from foregoing description, according to the present invention, even if the amplitude of the chucking voltage is exponentially decreased with respect to the chucking time after the chucking operation starts, an chucking force high enough to hold the substrate may be produced. In addition, by exponentially decreasing the amplitude of the chucking voltage, even if the chucking time of the substrate is long, it is possible to prevent an increase of the a residual chucking force, which is present after the chucking voltage is turned off. Accordingly, it is easy to separate the substrate after the chucking operation ends. In the present invention, the amplitude of the chucking voltage is exponentially and smoothly decreased with the elapse of the chucking time, while in the related-art technique, the amplitude of the chucking voltage is varied in two steps at predetermined timings. Therefore, there is no need of taking the chucking voltage changing timings into consideration, and the chucking voltage control is easy.

As a result, a sufficiently high chucking force is produced during the substrate chucking operation irrespective of the chucking time length and the substrate processing timings. Further, it is easy to separate the substrate after the chucking operation ends.

What is claimed is:

1. A method for chucking a substrate used for a substrate chucking apparatus having an electrostatic chuck for electrostatically chucking the substrate and a power supply for applying a chucking voltage to the electrostatic chuck, the method comprising:

controlling an amplitude of the chucking voltage so that the amplitude of the chucking voltage is exponentially decreased with respect to a chucking time after an operation of chucking the substrate starts;

wherein an initial amplitude of the chucking voltage is in the range of approximately 1500 volts to 3700 volts, the chucking time is approximately 1500 to 1800 seconds, and a final amplitude of the chucking voltage at the end of the chucking time is in the range of 600 volts to 1200 volts.

2. An apparatus for chucking a substrate wherein, the apparatus comprises:

an electrostatic chuck for electrostatically chucking the substrate;

a power source for applying a chucking voltage to the electrostatic chuck; and a control device for controlling the amplitude of the chucking voltage so that the amplitude of the chucking voltage is exponentially decreased with respect to the chucking time after an operation of chucking the substrate starts;

wherein the control device limits an initial amplitude of the chucking voltage in the range of approximately 1500 volts to 3700 volts, while the chucking time is approximately 1500 to 1800 seconds, and the control device limits a final amplitude of the chucking voltage at the end of the chucking time to the range of 600 volts to 1200 volts.

3. The apparatus for chucking the substrate according to claim 2, wherein the electrostatic chuck has an insulating member and an electrode contained in the insulating member and wherein the chucking voltage is applied to the electrode of the electrostatic chuck.

* * * * *